(12) United States Patent
Wang

(10) Patent No.: US 10,367,488 B2
(45) Date of Patent: Jul. 30, 2019

(54) DEVICE AND METHOD FOR ELIMINATING ELECTROMAGNETIC INTERFERENCE

(71) Applicants: HKC Corporation Limited, Shenzhen, Guangdong (CN); Chongqing HKC Optoelectronics Technology Co., Ltd., Chongqing (CN)

(72) Inventor: Mingliang Wang, Chongqing (CN)

(73) Assignees: HKC CORPORATION LIMITED, Shenzhen, Guangdong (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/580,644

(22) PCT Filed: Sep. 19, 2017

(86) PCT No.: PCT/CN2017/102235
§ 371 (c)(1),
(2) Date: Dec. 7, 2017

(87) PCT Pub. No.: WO2019/037180
PCT Pub. Date: Feb. 28, 2019

(65) Prior Publication Data
US 2019/0068178 A1 Feb. 28, 2019

(30) Foreign Application Priority Data
Aug. 25, 2017 (CN) .......................... 2017 1 0744166

(51) Int. Cl.
*H03L 7/08* (2006.01)
*H03L 7/16* (2006.01)
(Continued)

(52) U.S. Cl.
CPC ............ *H03K 5/1252* (2013.01); *H03K 21/08* (2013.01); *H03L 7/08* (2013.01); *G09G 5/003* (2013.01);
(Continued)

(58) Field of Classification Search
CPC ........ H03K 5/1252; H03K 21/08; H03L 7/08; G09G 5/003; G09G 2330/06; G09G 2330/02; H02M 3/07
See application file for complete search history.

(56) References Cited

U.S. PATENT DOCUMENTS 5,703,537 A * 12/1997 Bland ...................... H03L 7/183
                                                                  331/1 A
5,796,311 A * 8/1998 Ishii ......................... H03L 7/191
                                                                  331/1 A
(Continued)

FOREIGN PATENT DOCUMENTS

CN          1435009 A          8/2003
CN          102361454 A        2/2012
(Continued)

*Primary Examiner* — Kenneth B Wells
(74) *Attorney, Agent, or Firm* — Muncy, Geissler, Olds & Lowe, P.C.

(57) ABSTRACT

This application relates to a device and a method for eliminating electromagnetic interference (EMI). The device for eliminating EMI includes: a timing control chip; and a phase-locked loop module, electrically connected to the timing control chip and including: a phase detection unit, configured to detect a frequency generated by a clock cycle to generate a frequency difference; a charge pump unit, configured to generate a regulation voltage; a voltage-controlled oscillator unit, configured to control an oscillation frequency when the regulation voltage is input; a plurality of frequency divider units, configured to generate a new output clock frequency by using an input clock frequency; and a selector unit, configured to select the appropriate frequency (Continued)

divider units, where the selector unit has another end electrically connected to needed power circuits.

9 Claims, 5 Drawing Sheets

(51) Int. Cl.
    *H04B 1/40*     (2015.01)
    *H03K 5/1252*     (2006.01)
    *H03K 21/08*     (2006.01)
    *G09G 5/00*     (2006.01)
    *H02M 3/07*     (2006.01)

(52) U.S. Cl.
    CPC ..... *G09G 2330/02* (2013.01); *G09G 2330/06* (2013.01); *H02M 3/07* (2013.01)

(56) References Cited

U.S. PATENT DOCUMENTS

| | | | |
|---|---|---|---|
| 6,859,106 B2 * | 2/2005 | Sano | H03L 7/18 |
| | | | 331/1 A |
| 7,973,608 B2 * | 7/2011 | Kato | H03L 7/093 |
| | | | 331/1 A |
| 8,106,714 B2 * | 1/2012 | Oh | H03L 7/099 |
| | | | 307/109 |
| 9,413,236 B2 | 8/2016 | Kim et al. | |
| 9,847,785 B2 * | 12/2017 | Nakai | H03L 7/095 |

FOREIGN PATENT DOCUMENTS

| | | |
|---|---|---|
| CN | 202268868 U | 6/2012 |
| CN | 103780252 A | 5/2014 |
| CN | 105391447 A | 3/2016 |
| CN | 205992895 U | 3/2017 |

\* cited by examiner

DEVICE AND METHOD FOR ELIMINATING ELECTROMAGNETIC INTERFERENCE

BACKGROUND

Technical Field

This application relates to a method for eliminating electromagnetic interference (EMI), and in particular, to a device and a method for eliminating EMI.

Related Art

Electronic products may generate electromagnetic radiation during operation, and electromagnetic radiation may interfere with normal operation of other devices or even affect human health. Therefore, most countries all draw up rules for electromagnetic radiation of electronic products to prevent EMI from bringing harm.

As one of components of an electronic product, an "integrated circuit (IC)" is one of primary sources of electromagnetic radiation. Electromagnetic radiation generated by an "inductor" in the IC may interfere with an external device and may also interfere with operation of internal components on some applications. Particularly, in an inductor-capacitor tank (LC tank) in a differential mode, if equivalent inductances of inductors at positive and negative ends are mutually asymmetric, a common-mode signal appears at a junction of the inductors at the positive and negative ends, and the common-mode signal exists on a metal wire electrically connected to the junction and causes electromagnetic radiation.

Currently, a common manner is using a power output end plus an EMI suppression component or using an RC (a resistor and a capacitor are connected in series) buffer circuit. However, the EMI suppression component can weaken only a part of conducted interference and cannot weaken radiated interference. The RC buffer circuit can have certain effects on a low-power circuit but is generally ineffective to a high-power circuit.

SUMMARY

To resolve the foregoing technical problem, an objective of this application is to provide a device and a method for eliminating EMI. A plurality of different switching frequencies is generated by using a signal frequency of a system output end to drive a power chip, and radiated interference is reduced by decentralizing the switching frequencies.

The objective of this application is achieved and the technical problem of this application is resolved by using the following technical solutions. A device for eliminating EMI provided according to this application comprises: a timing control chip; and a phase-locked loop module, electrically connected to the timing control chip and comprising: a phase detection unit, configured to detect a frequency generated by a clock cycle to generate a frequency difference; a charge pump unit, configured to generate a regulation voltage; a voltage-controlled oscillator unit, configured to control an oscillation frequency when the regulation voltage is input; a plurality of frequency divider units, configured to generate a new output clock frequency by using an input clock frequency; and a selector unit, configured to select the appropriate frequency divider units, where the selector unit has another end electrically connected to needed power circuits.

A device for eliminating EMI of another objective of this application comprises: a timing control chip; and a phase-locked loop module, electrically connected to the timing control chip and comprising: a phase detection unit, configured to detect a frequency generated by a clock cycle to generate a frequency difference; a charge pump unit, configured to generate a regulation voltage; a voltage-controlled oscillator unit, configured to control an oscillation frequency when the regulation voltage is input; a plurality of frequency divider units, configured to generate a new output clock frequency by using an input clock frequency; and a selector unit, configured to select the appropriate frequency divider units, where the selector unit has another end electrically connected to needed power circuits, where the frequency divider units have at least one frequency dividing multiple, and the selector unit is electrically connected to at least four different power circuits.

A method for eliminating EMI of still another objective of this application comprises: receiving, by a timing control chip, one piece of display data, and outputting a data signal and a clock cycle signal after processing the display data; and electrically connecting, by a phase-locked loop module, to the timing control chip, comprising: detecting, by a phase detection unit, a frequency generated by a clock cycle to generate a frequency difference; generating, by a charge pump unit, a regulation voltage when the frequency difference is input; controlling, by a voltage-controlled oscillator unit, an oscillation frequency when the regulation voltage is input; generating, by a plurality of frequency divider units, a new output clock frequency by using an input clock frequency; and selecting, by a selector unit, the appropriate frequency divider units, where the selector unit has another end electrically connected to needed power circuits.

The technical problem of this application may be further resolved by taking the following technical measures.

In an embodiment of this application, the timing control chip receives one piece of display data by using a front-end system.

In an embodiment of this application, after processing the display data, the timing control chip outputs a data signal and a clock cycle signal.

In an embodiment of this application, a formula of generating the new output clock frequency by the frequency divider units is: the new output clock frequency=1/N multiplied by the input clock frequency, where N is an integer.

In an embodiment of this application, the frequency divider units have at least one frequency dividing multiple.

In an embodiment of this application, the device further comprises a power control chip, separately electrically connected to the phase-locked loop module and the timing control chip and is configured to control a power source to be supplied to the phase-locked loop module and the timing control chip.

In an embodiment of this application, in the method, the frequency divider units have at least one frequency dividing multiple.

In an embodiment of this application, in the method, a power control chip is further comprised and separately electrically connected to the phase-locked loop module and the timing control chip and is configured to control a power source to be supplied to the phase-locked loop module and the timing control chip.

In this application, a plurality of different switching frequencies is generated by using a signal frequency of a system output end to drive a power chip, and radiated interference is reduced by decentralizing the switching frequencies. Therefore, a problem of severe radiation of EMI of a power circuit is alleviated.

DETAILED DESCRIPTION

Figure 1A:
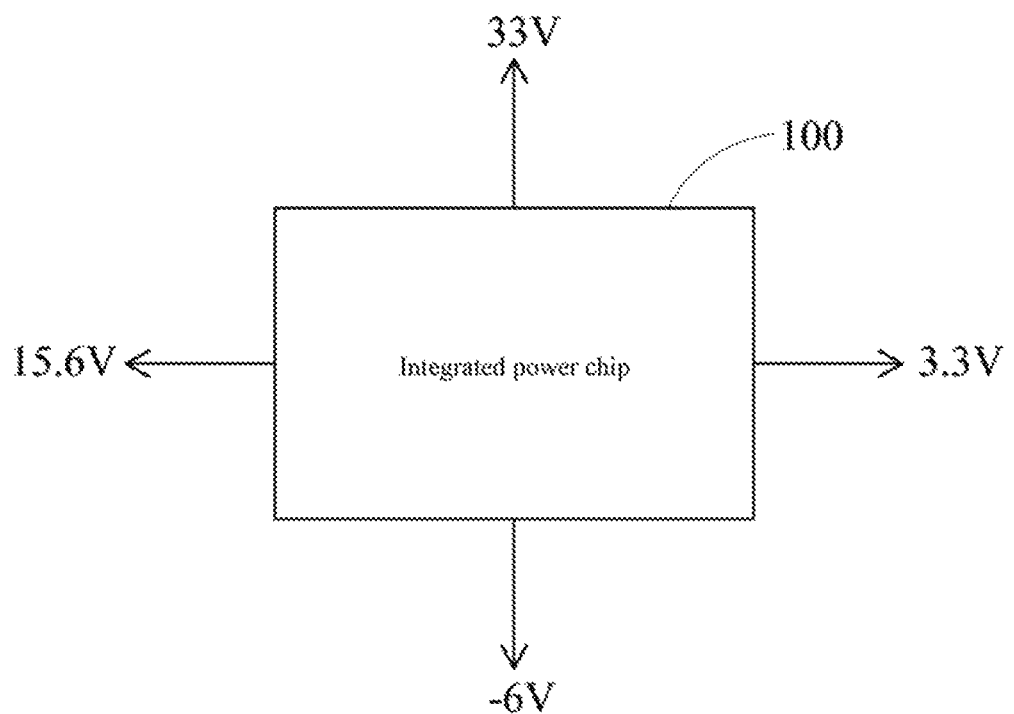
FIG. 1a is a schematic diagram of an exemplary power chip control architecture.

The following embodiments are described with reference to the accompanying drawings, used to exemplify specific embodiments for implementation of this application. Terms about directions mentioned in this application, such as "on", "below", "front", "back", "left", "right", "in", "out", and "side surface" merely refer to directions in the accompanying drawings. Therefore, the used terms about directions are used to describe and understand this application, and are not intended to limit this application.

In the embodiments of this application, to help explain the method of this application, it is assumed to perform the method of this application by using a device for eliminating EMI. However, it should be understood that the device and/or the method may change and do not need to be mutually associated and work completely according to the following descriptions. These changes all fall within the scope of the current embodiments. It can be understood that in some embodiments, the processing method of this application may be implemented in a device for eliminating EMI, for example, by running a drive chip. It should be emphasized that unless otherwise stated, the foregoing method of this application does not need to be performed according to a definite sequence shown in the figure. Moreover, a plurality of similar blocks may be performed in parallel, instead of being performed according to a sequence. Therefore, elements in the foregoing methods of this application are referred to as "blocks" rather than "steps" in this specification. It should further be understood that, the foregoing method may also be implemented on variations of a device for eliminating EMI. It may be further understood that the method of this application may be implemented in a processing system. However, the foregoing method may also be implemented in a similar system that has similar components with the foregoing system but is disposed in a configuration different from that of the foregoing system.

The accompanying drawings and the description are considered to be essentially exemplary, rather than limitative. In the figures, modules with similar structures are represented by using the same reference number. In addition, for understanding and ease of description, the size and the thickness of each component shown in the accompanying drawings are arbitrarily shown, but this application is not limited thereto.

In the accompanying drawings, for clarity, thicknesses of a layer, a film, a panel, an area, and the like are enlarged. In the accompanying drawings, for understanding and ease of description, thicknesses of some layers and areas are enlarged. It should be understood that when a component such as a layer, a film, an area, or a base is described to be "on" "another component", the component may be directly on the another component, or there may be an intermediate component.

In addition, throughout this specification, unless otherwise explicitly described to have an opposite meaning, the word "include" is understood as including the component, but not excluding any other component. In addition, throughout this specification, "on" means that one is located above or below a target component and does not necessarily mean that one is located on the top based on a gravity direction.

To further describe the technical means used in this application to achieve the application objective and effects thereof, specific implementations, structures, features, and effects of a device and a method for eliminating EMI that are provided according to this application are described in detail below with reference to the drawings and preferred embodiments.

Figure 1B:
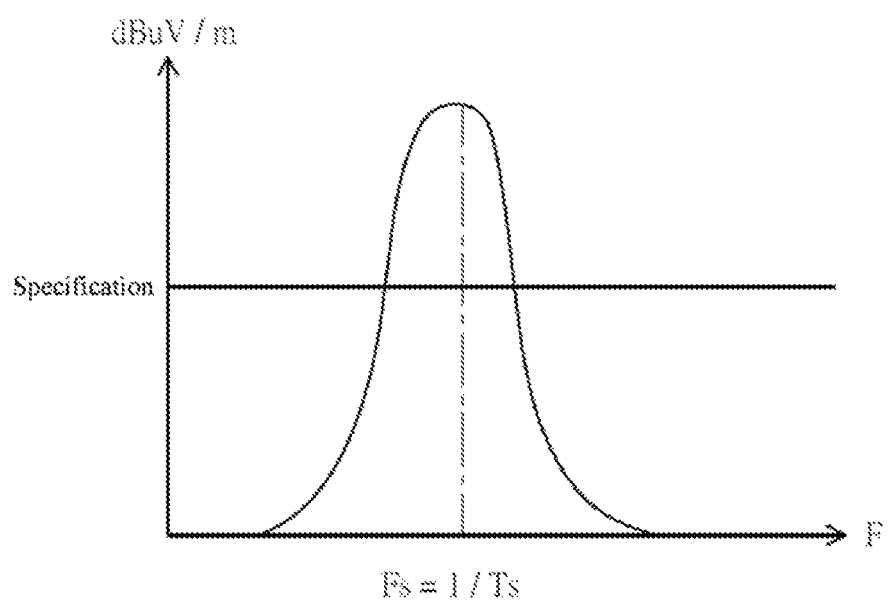
FIG. 1b is a schematic diagram of another exemplary power chip control architecture.

FIG. 1a is a schematic diagram of an exemplary power chip control architecture; FIG. 1b is a schematic diagram of another exemplary power chip control architecture. Referring to FIG. 1a and FIG. 1b, an integrated power chip 100 includes a plurality of power sources of 3.3 V, 15.6 V, 33 V, and −6 V. The plurality of power sources share a same input clock cycle (CLK) (a frequency of a CLK shown in FIG. 1b is Fs). In this way, radiation energy of the plurality of power sources on a frequency channel number of the input clock cycle CLK is centralized, and consequently EMI radiation exceeds a given standard.

Figure 2:
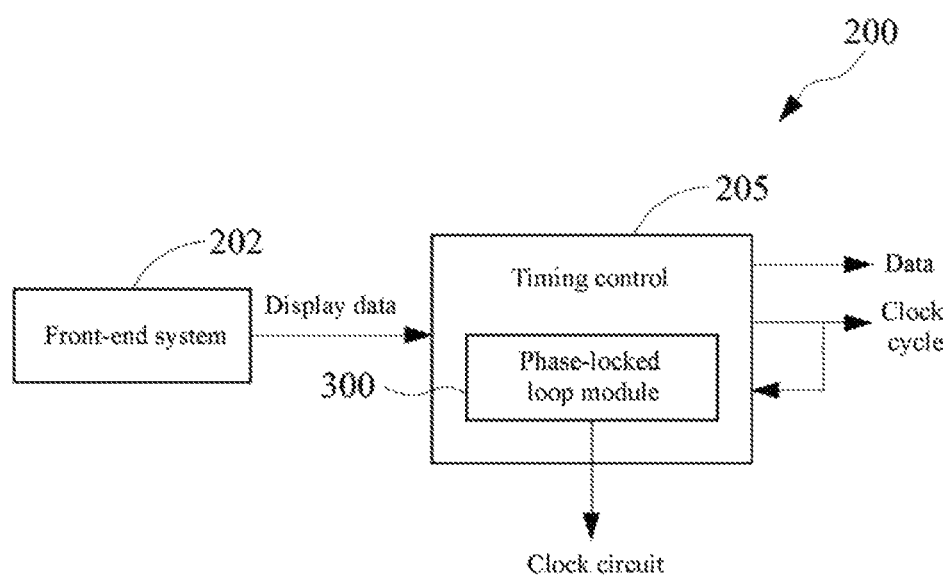
FIG. 2 is a block diagram of a device for eliminating EMI according to an embodiment of this application.
Figure 3:
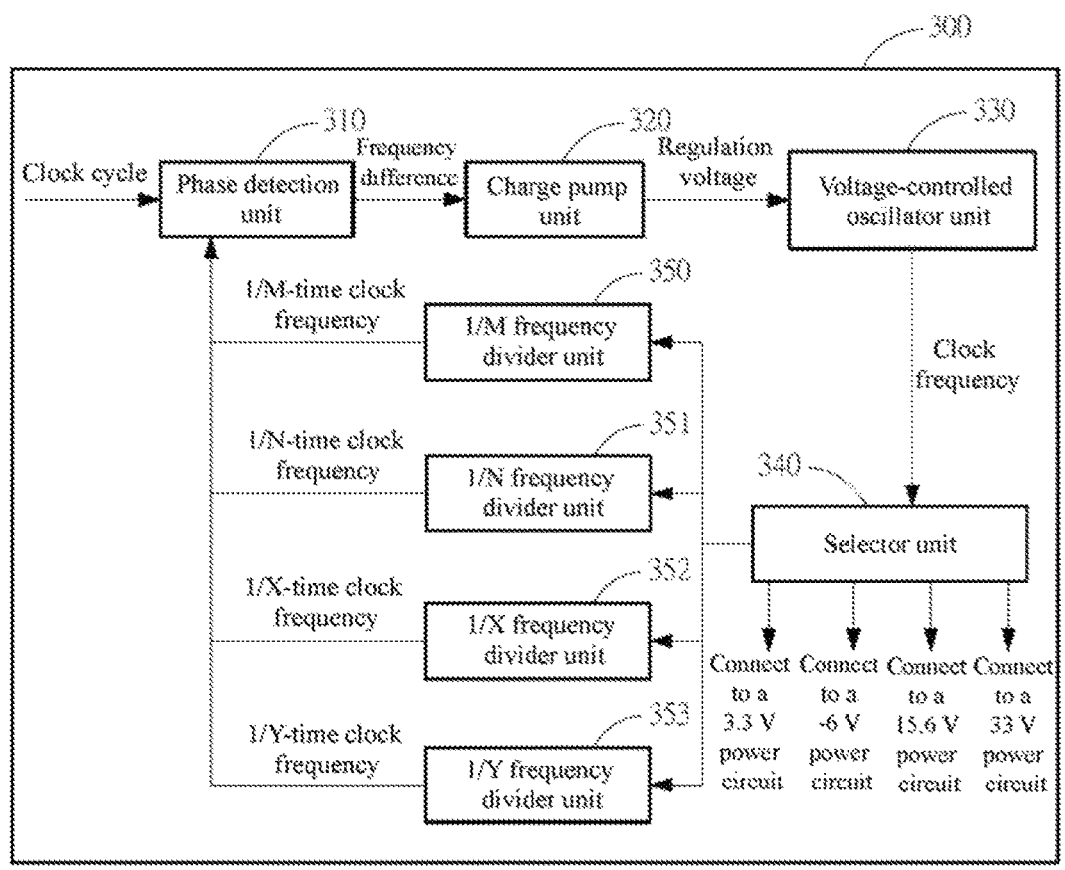
FIG. 3 is a block diagram of a phase-locked loop module according to an embodiment of this application.

FIG. 2 is a block diagram of a device for eliminating EMI according to an embodiment of this application; FIG. 3 is a block diagram of a phase-locked loop module according to an embodiment of this application. Referring to FIG. 2 and FIG. 3, in an embodiment of this application, a device 200 for eliminating EMI includes: a timing control chip 205; and a phase-locked loop module 300, electrically connected to the timing control chip 205 and including: a phase detection unit 310, configured to detect a frequency generated by a clock cycle to generate a frequency difference; a charge pump unit 320, configured to generate a regulation voltage; a voltage-controlled oscillator unit 330, configured to control an oscillation frequency when the regulation voltage is input; a plurality of frequency divider units 350, 351, 352, and 353, configured to generate a new output clock frequency by using an input clock frequency; and a selector unit 340, configured to select the appropriate frequency divider units 350, 351, 352, and 353, where the selector unit has another end electrically connected to needed power circuits.

Referring to FIG. 2 and FIG. 3, in an embodiment, the timing control chip 205 receives one piece of display data by using a front-end system 202.

Referring to FIG. 2 and FIG. 3, in an embodiment, after processing the display data, the timing control chip 205 outputs a data signal and a clock cycle signal.

Referring to FIG. 2 and FIG. 3, in an embodiment, a formula of generating the new output clock frequency by the frequency divider units 350 is: the new output clock frequency (f)=1/N multiplied by the input clock frequency (Fs), where N is an integer.

Referring to FIG. 2 and FIG. 3, in an embodiment, the frequency divider units 350, 351, 352, and 353 have at least one frequency dividing multiple.

Referring to FIG. 2 and FIG. 3, in an embodiment, the device further includes a power control chip (not shown in the figure), separately electrically connected to the phase-locked loop module 300 and the timing control chip 205 and configured to control a power source to be supplied to the phase-locked loop module 300 and the timing control chip 205.

Referring to FIG. 2 and FIG. 3, in an embodiment, a device 200 for eliminating EMI includes: a timing control chip 205; and a phase-locked loop module 300, electrically connected to the timing control chip 205 and including: a phase detection unit 310, configured to detect a frequency generated by a clock cycle to generate a frequency difference; a charge pump unit 320, configured to generate a regulation voltage; a voltage-controlled oscillator unit 330, configured to control an oscillation frequency when the regulation voltage is input; a plurality of frequency divider units 350, 351, 352, and 353, configured to generate a new output clock frequency by using an input clock frequency; and a selector unit 340, configured to select the appropriate frequency divider units 350, 351, 352, and 353, where the selector unit has another end electrically connected to needed power circuits, where the frequency divider units 350, 351, 352, and 353 have at least one frequency dividing multiple, and the selector unit 340 is electrically connected to at least four different power circuits.

Referring to FIG. 2 and FIG. 3, in an embodiment, four frequency dividing multiples are respectively M, N, X, and Y, and to share a same phase-locked loop module, a selector needs to be used for time division to perform different selections. If a frequency dividing multiple needed by a 3.3 V power circuit is M, and a frequency dividing multiple needed by a −6 V circuit is N, the selector unit 340 controls to select to connect to the 1/M frequency divider unit 350 at a first moment, and an output of a clock frequency (CLK_S) connects to a clock circuit of a 3.3 V power source. Then, at a next moment, the selector unit 340 connects to the 1/N frequency divider unit 351, and an output of the clock frequency (CLK_S) connects to a clock circuit of a −6 V power source. Sequential and cyclical connections are performed in this way, so that time-division multiplexing of the same phase-locked loop module 300 is implemented.

Figure 4:
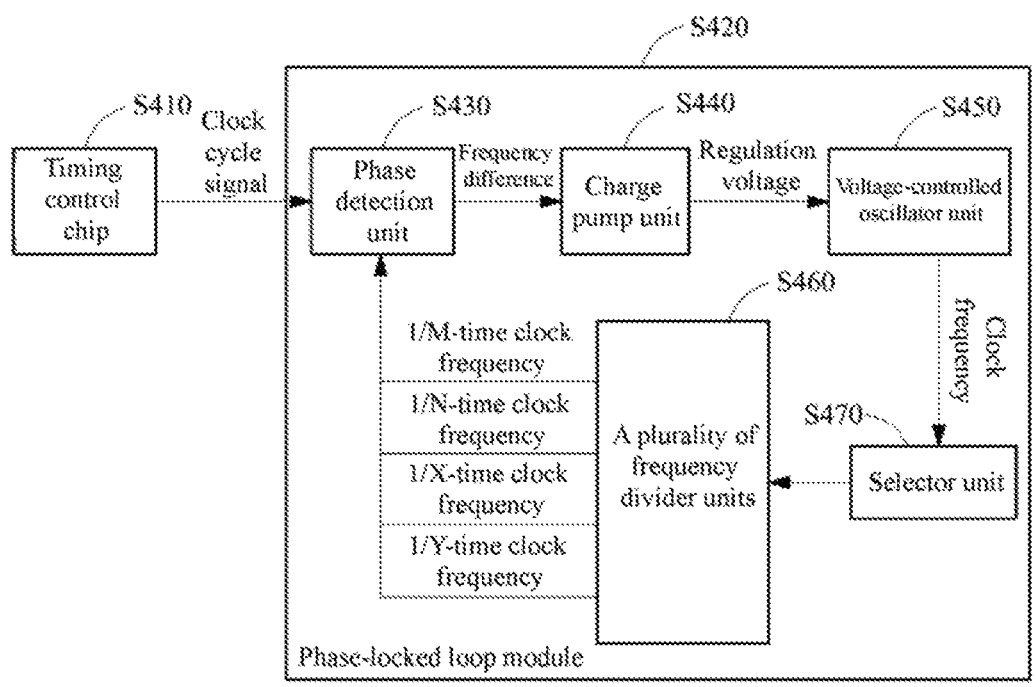
FIG. 4 is a flowchart of a phase-locked loop module according to an embodiment of this application.

FIG. 4 is a flowchart of a phase-locked loop module according to an embodiment of this application. Referring to FIG. 2, FIG. 3, and FIG. 4, in an embodiment of this application, a method for eliminating EMI includes: receiving, by a timing control chip 205, one piece of display data, and outputting a data signal and a clock cycle signal after processing the display data; and electrically connecting, by a phase-locked loop module 300, to the timing control chip 205, including: detecting, by a phase detection unit 310, a frequency generated by a clock cycle to generate a frequency difference; generating, by a charge pump unit 320, a regulation voltage when the frequency difference is input; controlling, by a voltage-controlled oscillator unit 330, an oscillation frequency when the regulation voltage is input; generating, by a plurality of frequency divider units 350, 351, 352, and 353, a new output clock frequency by using an input clock frequency; and selecting, by a selector unit 340, the appropriate frequency divider units 350, 351, 352, and 353, where the selector unit has another end electrically connected to needed power circuits.

Referring to FIG. 2 and FIG. 3, in an embodiment, in the method, the frequency divider units 350, 351, 352, and 353 have at least one frequency dividing multiple.

Referring to FIG. 2 and FIG. 3, in an embodiment, in the method, a power control chip (not shown in the figure) is further included and separately electrically connected to the phase-locked loop module 300 and the timing control chip 205 and is configured to control a power source to be supplied to the phase-locked loop module 300 and the timing control chip 205.

Referring to FIG. 3 and FIG. 4, in block S410, a timing control chip receives one piece of display data, and outputs a data signal and a clock cycle signal after processing the display data.

Referring to FIG. 3 and FIG. 4, in block S420, a phase-locked loop module electrically connects to the timing control chip.

Referring to FIG. 3 and FIG. 4, in block S430, a phase detection unit detects a frequency generated by a clock cycle to generate a frequency difference.

Referring to FIG. 3 and FIG. 4, in block S440, a charge pump unit generates a regulation voltage when the frequency difference is input.

Referring to FIG. 3 and FIG. 4, in block S450, a voltage-controlled oscillator unit controls an oscillation frequency when the regulation voltage is input.

Referring to FIG. 3 and FIG. 4, in block S460, a plurality of frequency divider units generates a new output clock frequency by using an input clock frequency.

Referring to FIG. 3 and FIG. 4, in block S470, a selector unit selects the appropriate frequency divider units, where the selector unit has another end electrically connected to needed power circuits.

In this application, a plurality of different switching frequencies are generated by using a signal frequency of a system output end to drive a power chip, and radiated interference is reduced by decentralizing the switching frequencies. Therefore, a problem of severe radiation of EMI of a power circuit is alleviated.

The wordings such as "in some embodiments" and "in various embodiments" are repeatedly used. The wordings usually refer to different embodiments, but they may also refer to a same embodiment. The words, such as "comprise", "have", and "include", are synonyms, unless other meanings are indicated in the context thereof.

Descriptions above are merely specific embodiments of this application, and are not intended to limit this application. Although this application has been disclosed above in forms of specific embodiments, the embodiments are not intended to limit this application. A person skilled in the art can make some equivalent variations, alterations or modifications to the above disclosed technical content without departing from the scope of the technical solutions of the above disclosed technical content to obtain equivalent embodiments. Any simple alteration, equivalent change or modification made to the foregoing embodiments according to the technical essence of this application without departing from the content of the technical solutions of this application shall fall within the scope of the technical solutions of this application.

What is claimed is:

1. A device for eliminating electromagnetic interference (EMI), comprising:
   a timing control chip; and
   a phase-locked loop module, electrically connected to the timing control chip and comprising:
   a phase detection unit, configured to detect a frequency generated by a clock cycle to generate a frequency difference;
   a charge pump unit, configured to generate a regulation voltage;
   a voltage-controlled oscillator unit, configured to control an oscillation frequency when the regulation voltage is input;
   a plurality of frequency divider units, configured to generate a new output clock frequency by using an input clock frequency; and
   a selector unit, configured to electrically connect to the plurality of frequency divider units,
   wherein the timing control chip receives one piece of display data by using a front-end system, wherein after processing the display data, the timing control chip outputs a data signal and a clock cycle signal,
wherein the frequency divider units have at least one frequency dividing multiple, and
wherein the selector unit is electrically connected to at least four different power circuits.

2. The device for eliminating EMI according to claim 1, wherein a formula of generating the new output clock frequency by the frequency divider units is: the new output clock frequency=1/N multiplied by the input clock frequency, wherein N is an integer.

3. The device for eliminating EMI according to claim 1, further comprising a power control chip, separately electrically connected to the phase-locked loop module and the timing control chip.

4. The device for eliminating EMI according to claim 3, wherein the power control chip is configured to control a power source to be supplied to the phase-locked loop module and the timing control chip.

5. A device for eliminating electromagnetic interference (EMI), comprising:
  a timing control chip; and
  a phase-locked loop module, electrically connected to the timing control chip and comprising:
  a phase detection unit, configured to detect a frequency generated by a clock cycle to generate a frequency difference;
  a charge pump unit, configured to generate a regulation voltage;
  a voltage-controlled oscillator unit, configured to control an oscillation frequency when the regulation voltage is input;
  a plurality of frequency divider units, configured to generate a new output clock frequency by using an input clock frequency; and
  a selector unit, configured to electrically connect to the plurality of frequency divider units, wherein the frequency divider units have at least one frequency dividing multiple,
  wherein the timing control chip receives one piece of display data by using a front-end system,
  wherein after processing the display data, the timing control chip outputs a data signal and a clock cycle signal,
  wherein the frequency divider units have at least one frequency dividing multiple, and
  wherein the selector unit is electrically connected to at least four different power circuits.

6. A method for eliminating electromagnetic interference (EMI), comprising steps of:
  receiving, by a timing control chip, one piece of display data, and outputting a data signal and a clock cycle signal after processing the display data; and
  electrically connecting, by a phase-locked loop module, to the timing control chip, comprising:
  detecting, by a phase detection unit, a frequency generated by a clock cycle to generate a frequency difference;
  generating, by a charge pump unit, a regulation voltage when the frequency difference is input;
  controlling, by a voltage-controlled oscillator unit, an oscillation frequency when the regulation voltage is input;
  generating, by a plurality of frequency divider units, a new output clock frequency by using an input clock frequency; and
  selecting, by a selector unit, the appropriate frequency divider units, wherein the selector unit has another end electrically connected to needed power circuits,
  wherein the timing control chip receives one piece of display data by using a front-end system,
  wherein after processing the display data, the timing control chip outputs a data signal and a clock cycle signal,
  wherein the frequency divider units have at least one frequency dividing multiple, and
  wherein the selector unit is electrically connected to at least four different power circuits.

7. The method for eliminating EMI according to claim 6, wherein a formula of generating the new output clock frequency by the frequency divider units is: the new output clock frequency=1/N multiplied by the input clock frequency, wherein N is an integer.

8. The method for eliminating EMI according to claim 6, wherein a power control chip is separately electrically connected to the phase-locked loop module and the timing control chip.

9. The method for eliminating EMI according to claim 8, wherein the power control chip is configured to control a power source to be supplied to the phase-locked loop module and the timing control chip.

* * * * *